United States Patent
Fushimi

(10) Patent No.: US 6,282,252 B1
(45) Date of Patent: Aug. 28, 2001

(54) RECEIVER FOR DATA TRANSMISSION

(75) Inventor: Takao Fushimi, Fukushima-ken (JP)

(73) Assignee: Alps Electric Co., Ltd., Tokyo (JP)

(*) Notice: Subject to any disclaimer, the term of this patent is extended or adjusted under 35 U.S.C. 154(b) by 0 days.

(21) Appl. No.: 09/227,557

(22) Filed: Jan. 8, 1999

(30) Foreign Application Priority Data

Jan. 12, 1998 (JP) .................................. 10-003898

(51) Int. Cl.[7] .............................. H03D 1/04; H03D 1/06; H04B 1/10; H04L 1/00; H03K 5/01
(52) U.S. Cl. ........................................... 375/346; 455/307
(58) Field of Search ................................... 375/316, 340, 375/346, 350, 347; 455/307; 326/119; 327/264, 272, 283, 389

(56) References Cited

U.S. PATENT DOCUMENTS

| | | |
|---|---|---|
| 3,619,786 | 11/1971 | Wilcox . |
| 5,933,770 * | 8/1999 | Heiter ................................... 455/307 |
| 5,974,101 * | 10/1999 | Nago ..................................... 375/350 |
| 5,999,559 * | 12/1999 | Takaki ................................... 375/130 |

FOREIGN PATENT DOCUMENTS

| | | |
|---|---|---|
| 3242547 A1 | 5/1984 | (DE) . |
| 4430989 C1 | 10/1995 | (DE) . |
| 0 203 895 A2 | 5/1986 | (EP) . |
| 0 322 157 A1 | 12/1988 | (EP) . |

* cited by examiner

Primary Examiner—Stephen Chin
Assistant Examiner—Lenny Jiang
(74) Attorney, Agent, or Firm—Brinks Hofer Gilson & Lione

(57) ABSTRACT

Described herein is a receiver for data transmission, which comprises a mixer for frequency-converting a received signal to an intermediate frequency signal, a local oscillator for inputting local oscillation signals to the mixer, a demodulator for demodulating the intermediate frequency signal to detect baseband signals, and a variable attenuator which is provided between the mixer and the demodulator and which has a PIN diode so as to hold constant the level of the intermediate frequency signal inputted to the demodulator. Means for attenuating a frequency band of the local oscillation signals is provided between the mixer and the variable attenuator.

3 Claims, 1 Drawing Sheet

RECEIVER FOR DATA TRANSMISSION

BACKGROUND OF THE INVENTION

1. Field of the Invention

The present invention relates to a receiver suitable for data transmission, which transmits data through the use of a satellite broadcasting system.

2. Description of the Related Art

A conventional receiver for data transmission (hereinafter called simply "a receiver") will be explained in accordance with FIG. 2. FIG. 2 shows a part of a circuit for the conventional receiver.

A data transmission signal is first transmitted from a satellite in a 11 GHz to 12 GHz band corresponding to the same frequency band as that for satellite broadcasting signals. The data transmission signal is frequency-converted to a band of about 950 MHz to 2150 MHz by an unillustrated down converter provided outdoors, after which it is inputted to an input terminal 31 of the receiver.

The data transmission signal (hereinafter called "received signal") inputted to the input terminal 31 is amplified by a low-noise amplifier 32 after which it is inputted to a mixer 34 through a first variable attenuator 33. An unillustrated PIN diode is used for the first variable attenuator 33. The amount of attenuation thereof is controlled by a current which flows through the PIN diode. The mixer 34 is comprised of a dual gate MOS FET (Field Effect Transistor) (hereinafter called simply "FET"). The received signal is inputted to a first gate of the FET. Each local oscillation signal generated from a local oscillator 35 is inputted to a second gate of the FET through a buffer amplifier 36. The mixer 34 frequency-converts the received signal to an intermediate frequency signal whose center frequency is about 480 MHz. Thus, the local oscillator 35 generates oscillations between about 1430 MHz and 2630 MHz in association with a frequency band for the received signal.

The intermediate frequency signal is outputted from the drain of the FET for the mixer 34 and inputted to a second variable attenuator 38 through an impedance matching circuit 37. The impedance matching circuit 37 is used to match the output impedance of the FET corresponding to the mixer 34 to the impedance of the second variable attenuator 38 and comprises a capacitor 37a, an inductor 37b and a resistor 37c electrically connected in parallel. A PIN diode is used even for the second variable attenuator 38 although not shown in the drawing. The amount of attenuation thereof is controlled by a current which flows through the PIN diode.

The intermediate frequency signal whose level is controlled by the second variable attenuator 38, is inputted to a demodulator 42 via a first intermediate frequency amplifier 39, an intermediate frequency filter 40 and a second intermediate frequency amplifier 41 in that order. The intermediate frequency filter 40 is made up of a bandpass filter whose center frequency is about 480 MHz and whose bandwidth is about 30 MHz. Further, the intermediate frequency signal is demodulated by the demodulator 42 from which baseband signals (I signal and Q signal) are outputted.

On the other hand, the output of the second intermediate frequency amplifier 41 is inputted even to a detector 43. The detector 43 detects it and outputs an AGC voltage therefrom. The output AGC voltage is suitably amplified by a DC amplifier 44, followed by supply to the first variable attenuator 33 and the second variable attenuator 38, whereby the currents flowing through their PIN diodes are controlled.

That is, the amount of attenuation of the first variable attenuator 33 and the amount of attenuation of the second variable attenuator 38 are controlled according to the AGC voltage obtained based on the output of the second intermediate frequency amplifier 41, whereby the level of the received signal corresponding to the RF signal inputted to the mixer 34 and the level of the intermediate frequency signal inputted to the demodulator 42 are controlled so as to become approximately constant respectively.

In the conventional receiver described above, the first variable attenuator 33 and the second variable attenuator 38 are provided on the input and output sides of the mixer 34 respectively to control the level of the RF signal inputted to the mixer 34 and the level of the intermediate frequency signal inputted to the demodulator 42 so that they are held constant. Since, however, the PIN diodes are respectively used for the first variable attenuator 33 and the second variable attenuator 38, they are excited by the RF signal and the intermediate frequency signal respectively. As a result, large white noise is produced because the PIN diode used for the second variable attenuator 38 is particularly excited by the intermediate frequency signal whose level is made high by conversion gain of the mixer 34. In doing so, the white noise enters into the local oscillator 35 side through terminal-to-terminal capacitance between the second gate and drain of the FET constituting the mixer 34, so that a C/N ratio between the local oscillation signals is deteriorated.

That is, since a terminal-to-terminal capacitance of about 0.05 pF exists between the drain and second gate of the FET and a series resonance circuit having a resonance frequency of about 1800 MHz is formed between the terminal-to-terminal capacitance and the inductor 37b constituting the impedance matching circuit 37, a frequency component close to the resonance frequency, of the white noise produced from the PIN diode for the second variable attenuator 38 enters the local oscillator 35 to deteriorate the C/N ratio between the local oscillation signals.

Thus, since the received signal inputted to the mixer 34 is frequency-converted to the intermediate frequency signal, based on the local oscillation signals poor in C/N ratio, phase noise is superimposed on the frequency-converted intermediate frequency signal. Therefore, a problem arises in that so-called bit errors occur in data extracted based on I and Q signals corresponding to the baseband signals outputted from the demodulator 42. Its bit-error rate tends to increase as the amount of transmission of data decreases. This is because the ratio of noise to the number of data is considered to increase.

SUMMARY OF THE INVENTION

With the foregoing in view, it is therefore an object of the present invention to provide a receiver for data transmission, which is capable of reducing bit errors caused by deterioration of a C/N ratio between local oscillation signals due to white noise produced by a variable attenuator.

According to one aspect of this invention, for achieving the above object, there is provided a receiver suitable for data transmission, comprising: a mixer for frequency-converting a received signal to an intermediate frequency signal; a local oscillator for inputting each of local oscillation signals to the mixer; a demodulator for demodulating the intermediate frequency signal to detect baseband signals; a variable attenuator provided between the mixer and the demodulator, the variable attenuator having a PIN diode so as to hold constant the level of the intermediate frequency signal inputted to the demodulator; and means for attenuating a frequency band of the local oscillation signals, the attenuating means being provided between the mixer and the variable attenuator.

In the data transmission receiver as well, the attenuating means is constructed as a band elimination filter.

Further, in the data transmission receiver, the frequency of the intermediate frequency signal is set lower than that of the local oscillation signal and the attenuating means is constructed as a low-pass filter having a cut-off frequency between the frequency of the intermediate frequency signal and that of the local oscillation signal.

Moreover, in the data transmission receiver, the frequency of the intermediate frequency signal is lower than that of the local oscillation signal and the attenuating means is made up of only a capacitor having a small capacitance value, which is electrically connected between an input terminal of the variable attenuator and the ground.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

Figure 1:
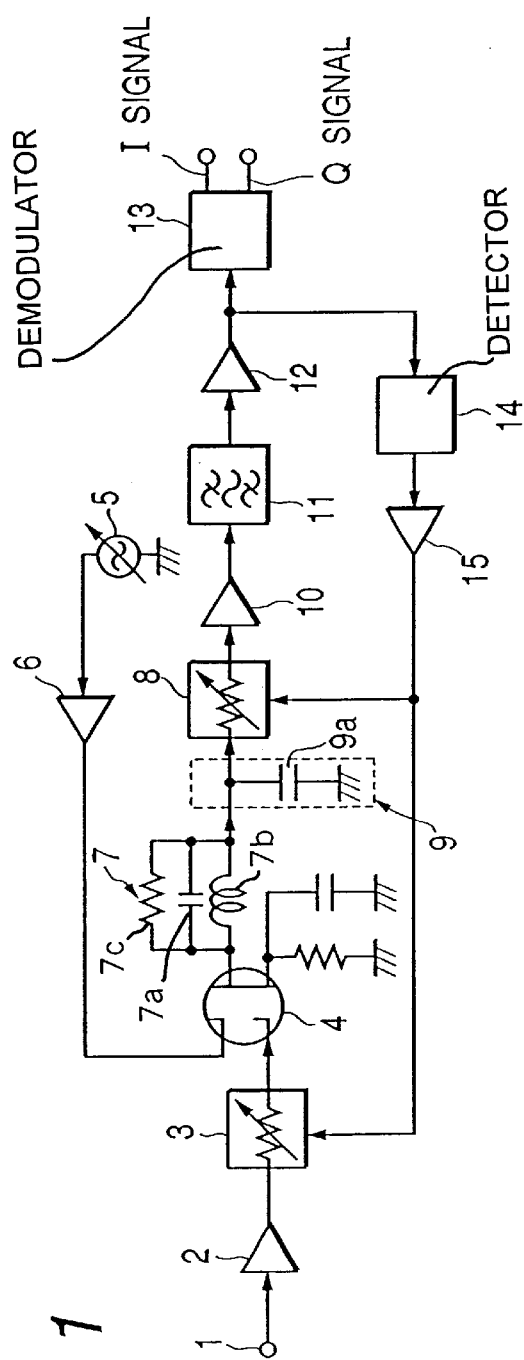
FIG. 1 is a circuit diagram showing a receiver for data transmission, according to the present invention.
Figure 2:
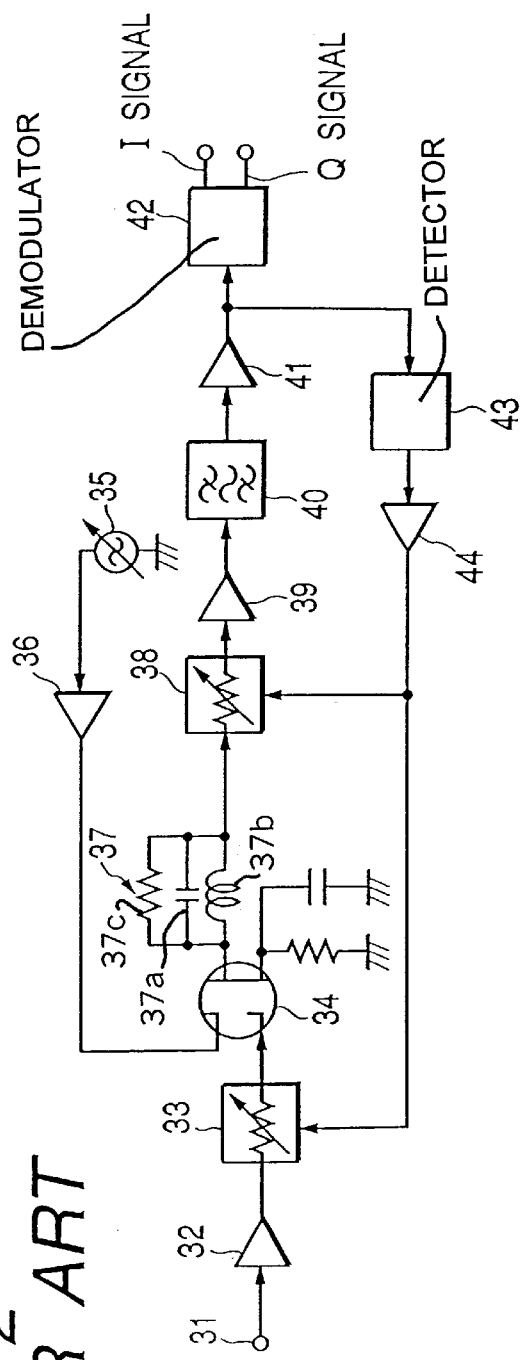
FIG. 2 is a circuit diagram illustrating a conventional receiver for data transmission.

A receiver suitable for data transmission (hereinafter called simply "a receiver"), according to the present invention will be described in accordance with FIG. 1. FIG. 1 shows a part of a circuit for the receiver according to the present invention.

A data transmission signal is first transmitted from a satellite in a 11 GHz to 12 GHz band corresponding to the same frequency band as that for satellite broadcasting signals. The data transmission signal is frequency-converted to a band of about 950 MHz to 2150 MHz by an unillustrated down converter provided outdoors, after which it is inputted to an input terminal 1 of the receiver.

The data transmission signal (hereinafter called "received signal") inputted to the input terminal 1 is amplified by a low-noise amplifier 2, after which it is inputted to a mixer 4 through a first variable attenuator 3. An unillustrated PIN diode is used for the first variable attenuator 3. The amount of attenuation thereof is controlled by a current which flows through the PIN diode. The mixer 4 is comprised of a dual gate MOS FET (Field Effect Transistor) (hereinafter called simply "FET"). The received signal is inputted to a first gate of the FET. An oscillation signal generated from a local oscillator 5 is inputted to a second gate of the FET through a buffer amplifier 6. The mixer 4 frequency-converts the received signal to an intermediate frequency signal whose center frequency is about 480 MHz. Thus, the local oscillator 5 generates oscillations between about 1430 MHz and 2630 MHz in association with the frequency band for the received signal.

The intermediate frequency signal is outputted from the drain of the FET for the mixer 4 and inputted to a second variable attenuator 8 through an impedance matching circuit 7. The impedance matching circuit 7 is used to match the output impedance of the FET corresponding to the mixer 4 to the impedance of the second variable attenuator 8 and comprises a capacitor 7a, an inductor 7b and a resistor 7c electrically connected in parallel. Attenuating means 9 for attenuating about 1430 MHz to 2630 MHz corresponding to a band of local oscillation frequencies generated from the local oscillator 5 is provided between the mixer 4 and the second variable attenuator 8, described more specifically, between the impedance matching circuit 7 and the second variable attenuator 8 connected to the output side of the mixer 4. The attenuating means 9 may be constructed as a band elimination filter. Since each local oscillation frequency is higher than the intermediate frequency, a low-pass filter with a frequency between the intermediate frequency and the lowest frequency of the local oscillation frequencies, e.g., a frequency slightly higher than the intermediate frequency as a cut-off frequency may be used as the attenuating means 9. Alternatively, the attenuating means 9 may be comprised of a capacitor 9a having a small capacitance (of less than 10 Pf), which allows an input terminal of the second variable attenuator 8 to be connected in shunt with ground, as shown in FIG. 1. If the low-pass filter is used, then the attenuating means 9 can be simply comprised of an inductor and a capacitor. Further, the use of the small-capacity type capacitor 9a makes the attenuating means 9 simpler. A PIN diode is used even for the second variable attenuator 8 although not shown in the drawing. The amount of attenuation thereof is controlled by a current which flows through the PIN diode.

The intermediate frequency signal whose level is controlled by the second variable attenuator 8 is inputted to a demodulator 13 via a first intermediate frequency amplifier 10, an intermediate frequency filter 11 and a second intermediate frequency amplifier 12 in this order. The intermediate frequency filter 11 is made up of a bandpass filter whose center frequency is about 480 MHz and whose bandwidth is about 30 MHz. Further, the intermediate frequency signal is demodulated by the demodulator 13 from which baseband signals (I signal and Q signal) are outputted.

On the other hand, the output of the second intermediate frequency amplifier 12 is inputted even to a detector 14. The detector 14 takes out an AGC voltage corresponding to the level of the intermediate frequency signal. Thereafter, the AGC voltage is suitably amplified by a DC amplifier 15, followed by supply to the first variable attenuator 3 and the second variable attenuator 8, whereby the currents flowing through their PIN diodes are controlled.

That is, the amount of attenuation of the first variable attenuator 3 and the amount of attenuation of the second variable attenuator 8 are controlled by the AGC voltage obtained based on the output of the second intermediate frequency amplifier 12, whereby the level of the received signal corresponding to the RF signal inputted to the mixer 4 and the level of the intermediate frequency signal inputted to the demodulator 13 are controlled so as to become approximately constant respectively.

Meanwhile, the PIN diodes are used for the first variable attenuator 3 and the second variable attenuator 8 respectively. These diodes, particularly, the PIN diode used for the second variable attenuator 8 is excited by the intermediate frequency signal whose level has been increased by conversion gain of the mixer 4, so that large white noise is produced. Since, however, the attenuating means 9 for attenuating about 1430 MHz to 2630 MHz corresponding to the band of the local oscillation frequencies generated from the local oscillator 5 is provided between the mixer 4 and the second variable attenuator 8, white noise lying within the above band (ranging from 1430 MHz to 2630 MHz), of the white noise generated by the PIN diode used for the second variable attenuator 8, is set so as not to be transmitted to the mixer 4 side. Therefore, a C/N ratio between the local oscillation signals is not deteriorated because the white noise lying in the above band does not enter even into the local oscillator 5.

Thus, no phase noise is superimposed on the intermediate frequency signal frequency-converted by the mixer 4 and no error occurs in data based on the baseband signals demodulated by the demodulator 13.

As has been described above, a data transmission receiver according to the present invention comprises a mixer for frequency-converting a received signal to an intermediate frequency signal, a local oscillator for inputting each local oscillation signal to the mixer, a demodulator for demodulating the intermediate frequency signal to detect baseband signals, and a variable attenuator which is provided between the mixer and the demodulator and which has a PIN diode so as to hold constant the level of the intermediate frequency signal inputted to the demodulator. Further, attenuating means for attenuating a frequency band of the local oscillation signals is provided between the mixer and the variable attenuator. Therefore, white noise lying in the frequency band of the local oscillation signals, of white noise generated by the PIN diode for the variable attenuator is not transmitted to the mixer side. Therefore, a C/N ratio between the local oscillation signals is not deteriorated because the white noise lying in the above band does not enter even into the local oscillator.

Thus, no phase noise is superimposed on the intermediate frequency signal frequency-converted by the mixer and no error occurs in data based on the baseband signals demodulated by the demodulator.

According to the data transmission receiver according to the present invention as well, since the attenuating means is constructed as a band elimination filter, the band of the local oscillation frequencies can be attenuated with reliability.

Further, according to the data transmission receiver according to the present invention, since the frequency of an intermediate frequency signal is set lower than that of each local oscillation signal and the attenuating means is made up of a low-pass filter having a cut-off frequency between the frequency of the intermediate frequency signal and that of each local oscillation signal, the attenuating means can be simplified in configuration.

Moreover, according to the data transmission receiver according to the present invention, since the frequency of the intermediate frequency signal is lower than that of each local oscillation signal and the attenuating means is comprised of only a capacitor having a small capacitance value, which is electrically connected between an input terminal of the variable attenuator and the ground, the attenuating means can be further simplified.

While the present invention has been described with reference to the illustrative embodiment, this description is not intended to be construed in a limiting sense. Various modifications of the illustrative embodiment will be apparent to those skilled in the art on reference to this description. It is therefore contemplated that the appended claims will cover any such modifications or embodiments as fall within the true scope of the invention.

| ATTACHMENT A | |
|---|---|
| Guy W. Shoup | 26,805 |
| Allan J. Sternstein | 27,396 |
| Gustavo Siller, Jr. | 32,305 |
| John C. Freeman | 34,483 |
| William F. Prendergast | 34,699 |
| Vita G. Conforti | 39,639 |
| Mark H. Remus | 40,141 |
| Steven G. Steger | 40,185 |
| Tadashi Horie | 40,437 |
| Joseph F. Hetz | 41,070 |
| Jason C. White | 42,223 |

What is claimed is:

1. A receiver suitable for data transmission, comprising:

a mixer for frequency-converting a received signal to an intermediate frequency signal;

a local oscillator for inputting local oscillation signals to said mixer;

a demodulator for demodulating the intermediate frequency signal to detect baseband signals;

a variable attenuator provided between said mixer and said demodulator, said variable attenuator having a PIN diode so as to hold constant the level of the intermediate frequency signal inputted to said demodulator; and impedance matching circuitry provided between said mixer and said variable attenuator, said impedance matching circuitry having a circuit consisting of a capacitor, an inductor, and a resistor connected in parallel to each other so as to match an output impedance of said mixer to said variable attenuator; wherein:

said mixer is formed of a dual-gate MOS FET;

said received signal is input into a first gate of said dual-gate MOS FET, and the local oscillation signals from said local oscillator are input into a second gate of said dual-gate MOS FET;

an input terminal of said impedance matching circuitry is connected to a drain of said dual-gate MOS FET; and a band elimination filter for attenuating a frequency band of the local oscillation signals is disposed between an output terminal of said impedance matching circuitry and an input terminal of said variable attenuator.

2. A receiver suitable for data transmission, comprising:

a mixer for frequency-converting a received signal to an intermediate frequency signal;

a local oscillator for inputting local oscillation signals to said mixer;

a demodulator for demodulating the intermediate frequency signal to detect baseband signals;

a variable attenuator provided between said mixer and said demodulator, said variable attenuator having a PIN diode so as to hold constant the level of the intermediate frequency signal inputted to said demodulator; and impedance matching circuitry provided between said mixer and said variable attenuator, said impedance matching circuitry having a circuit consisting of a capacitor, an inductor, and a resistor connected in parallel to each other so as to match an output impedance of said mixer to said variable attenuator; wherein:

said mixer is formed of a dual-gate MOS FET;

said received signal is input into a first gate of said dual-gate MOS FET, and the local oscillation signals from said local oscillator are input into a second gate of said dual-gate MOS FET;

an input terminal of said impedance matching circuitry is connected to a drain of said dual-gate MOS FET;

the frequency of the intermediate frequency signal is set lower than that of the local oscillation signals; and a low-pass filter having a cut-off frequency between the frequency of the intermediate frequency signal and that of the local oscillation signals is disposed between an output terminal of said impedance matching circuitry and an input terminal of said variable attenuator.

3. A receiver suitable for data transmission, comprising:

a mixer for frequency-converting a received signal to an intermediate frequency signal;

a local oscillator for inputting local oscillation signals to said mixer;

a demodulator for demodulating the intermediate frequency signal to detect baseband signals;

a variable attenuator provided between said mixer and said demodulator, said variable attenuator having a PIN diode so as to hold constant the level of the intermediate frequency signal inputted to said demodulator; and impedance matching circuitry provided between said mixer and said variable attenuator, said impedance matching circuitry having a circuit consisting of a capacitor, an inductor, and a resistor connected in parallel to each other so as to match an output impedance of said mixer to said variable attenuator; wherein:

said mixer is formed of a dual-gate MOS FET;

said received signal is input into a first gate of said dual-gate MOS FET, and the local oscillation signals from said local oscillator are input into a second gate of said dual-gate MOS FET;

an input terminal of said impedance matching circuitry is connected to a drain of said dual-gate MOS FET;

an output terminal of said impedance matching circuitry is connected to an input terminal of said variable attenuator;

the frequency of the intermediate frequency signal is lower than that of the local oscillation signals; and a capacitor having a small capacitance value is connected between the input terminal of said variable attenuator and a ground.

\* \* \* \* \*

UNITED STATES PATENT AND TRADEMARK OFFICE
CERTIFICATE OF CORRECTION

PATENT NO.    : 6,282,252 B1
DATED         : August 28, 2001
INVENTOR(S)   : Takao Fushimi It is certified that error appears in the above-identified patent and that said Letters Patent is hereby corrected as shown below:

<u>Column 6,</u>
Delete lines 1 through 14.

Signed and Sealed this

Fourteenth Day of May, 2002

Attest:

JAMES E. ROGAN
*Attesting Officer*   *Director of the United States Patent and Trademark Office*